(12) United States Patent
Kwon et al.

(10) Patent No.: US 7,439,197 B2
(45) Date of Patent: Oct. 21, 2008

(54) METHOD OF FABRICATING A CAPACITOR

(75) Inventors: Jang-yeon Kwon, Seongnam-si (KR); Hyuk Lim, Seoul (KR); Takashi Noguchi, Seongnam-si (KR); Young-soo Park, Suwon-si (KR); Suk-pil Kim, Yongin-si (KR); Hans S. Cho, Seoul (KR); Ji-sim Jung, Incheon-si (KR); Kyung-bae Park, Seoul (KR); Do-young Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/267,264

(22) Filed: Nov. 7, 2005

(65) Prior Publication Data

US 2006/0099778 A1    May 11, 2006

(30) Foreign Application Priority Data

Nov. 8, 2004    (KR) .................... 10-2004-0090495

(51) Int. Cl.
*H01L 21/00*    (2006.01)
*C30B 23/00*    (2006.01)

(52) U.S. Cl. ........................................ 438/798; 117/92

(58) Field of Classification Search ................. 438/795, 438/798; 117/92, 103, 108; 250/492.2
See application file for complete search history.

(56) References Cited

U.S. PATENT DOCUMENTS

| | | | | |
|---|---|---|---|---|
| 4,179,312 A * | 12/1979 | Keller et al. | ................... | 117/9 |
| 4,376,688 A * | 3/1983 | Ceasar et al. | .......... | 204/192.11 |
| 4,492,736 A * | 1/1985 | Tanner | ....................... | 428/446 |
| 4,637,869 A * | 1/1987 | Glocker et al. | ......... | 204/192.11 |
| 4,673,475 A | 6/1987 | Windischmann | | |
| 5,192,393 A * | 3/1993 | Muranaka et al. | ........... | 427/582 |
| 5,523,587 A * | 6/1996 | Kwo | ........................... | 257/64 |
| 5,633,194 A * | 5/1997 | Selvakumar et al. | ........ | 117/103 |
| RE37,294 E * | 7/2001 | Knapp et al. | ................ | 427/534 |
| 6,620,658 B2 * | 9/2003 | Isobe et al. | ................. | 438/151 |

FOREIGN PATENT DOCUMENTS

JP    57-160909    10/1992

OTHER PUBLICATIONS

C. D. Tucker et al., "Ion-Beam-Assisted-Deposition of Non-Hydrogenated a-Si:C films", Mar. 1996, Canadian Journal of Physics, vol. 74, pp. 97-101.*
Korean Office Action dated Jan. 31, 2006.

* cited by examiner

*Primary Examiner*—W. David Coleman
(74) *Attorney, Agent, or Firm*—Buchanan Ingersoll & Rooney PC (57) ABSTRACT

A method of preparing a semiconductor film on a substrate is disclosed. The method includes arranging an insulating substrate in a deposition chamber and depositing a semiconductor film onto the insulating substrate using ion beam deposition, wherein a temperature of the insulating substrate during the depositing does not exceed 250° C. The method can produce a thin film transistor. The disclosed ion beam deposition method forms, at lower temperature and with low impurities, a film morphology with desired smoothness and grain size. Deposition of semiconductor films on low melting point substrates, such as plastic flexible substrates, is enables.

13 Claims, 7 Drawing Sheets

METHOD OF FABRICATING A CAPACITOR

RELATED APPLICATION DATA

This application is based on and claims priority under 35 U.S.C. §119 to Korean Application No. 10-2004-0090495, filed Nov. 8, 2004, the entire contents of which are incorporated herein by reference.

FIELD OF THE DISCLOSURE

The present disclosure relates to methods of forming thin-film transistors. More specifically, the present disclosure relates to methods of depositing metal-oxide semiconductor field-effect transistors on insulating substrates at low temperatures.

STATE OF THE ART

In the discussion of the state of the art that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

Thin-film transistors (TFTs) formed from metal-oxide semiconductor field-effect transistors (MOSFETs) deposited onto one of various substrates enable many electronics applications. For example, semiconductor-based devices on substrates such as quartz and sapphire can form electronic devices such as laser diodes and liquid crystals.

Conventional deposition methods to form semiconductor-based devices on substrates include low pressure chemical vapor deposition (LPCVD) and plasma enhanced chemical vapor deposition (PECVD). In conventional LPCVD, deposition temperatures can be greater than 450° C. In conventional PECVD, deposition temperatures can be greater than 350° C. For conventional substrates such as quartz and sapphire, deposition temperatures of 350° C. to 450° C. or higher typically do not adversely impact the substrate or the resulting device. However, some substrate materials can be adversely impacted at the deposition temperatures associated with these conventional deposition methods.

Polymeric-based or plastic substrates with deposited high-quality polysilicon films are desirable for new generations of displays (e.g., paper-like display, portable HDTV). However, conventional approaches for preparing polysilicon films include low pressure CVD (LPCVD) and plasma enhanced CVD (PECVD), but these are carried out at temperatures too high for compatibility with plastic substrates (e.g., 450° C. and 350° C., respectively). Thus, sputtering is the conventional approach for depositing silicon films on plastic (presumably magnetron sputtering, where a high intensity plasma is formed directly above and close to the Si target). However, sputtered films contain argon, hydrogen and oxygen impurities.

In addition, grain size is a contributing factor to the performance of conventional TFT-type devices. In general, if the grain size is small, the performance of the TFT is close to that of a TFT incorporating amorphous silicon ($\alpha$-Si), and if the grain size is large enough, the performance of the TFT is close to a single crystalline silicon (Si) device, such as a device on a silicon wafer. Also, in general, grain influences the electron/hole mobility of the TFT, the subthreshold swing, the threshold voltage, and the leakage current of the TFT. As an example, for a glass substrate (<450° C. process temperature), 0.3 micrometer of grain size is commercial technology.

Therefore, it is desirable to have a low temperature or room temperature deposition method that can deposit materials that meet or exceed applicable quality standards for the electronics and manufacturing industries.

SUMMARY

It has surprisingly been found that a desirable film morphology (e.g., desirable smoothness and grain size), similar to the film morphology attainable with LPCVD, but at lower temperature (good for plastic substrate), and with significantly lower impurities than attainable by sputtering can be achieved.

An exemplary method of preparing a semiconductor film on a substrate comprises arranging an insulating substrate in a deposition chamber and depositing a semiconductor film onto the insulating substrate using ion beam deposition, wherein a temperature of the insulating substrate during the depositing does not exceed 250° C.

Disclosed methods can be used to produce a thin film transistor by, for example, preparing a semiconductor film on an insulating substrate as disclosed herein, forming, in the semiconductor film, a source region, a drain region, and a channel region between the source region and the drain region, and forming a gate electrode adjacent to the channel region

BRIEF DESCRIPTION OF THE DRAWING FIGURES

The following detailed description of preferred embodiments can be read in connection with the accompanying drawings in which like numerals designate like elements and in which.

DETAILED DESCRIPTION

According to exemplary embodiments, high-purity amorphous silicon ($\alpha$-Si) can be deposited onto various substrates (e.g., glass and plastic) at low temperature (e.g., room temperature) using ion beam deposition (IBD) of silicon. IBD involves directing a beam of ions from an ion source to a target spaced apart from the ion source. The deposited $\alpha$-Si films can then be crystallized by laser annealing to form high-quality polycrystalline silicon (polysilicon) films.

Figure 1:
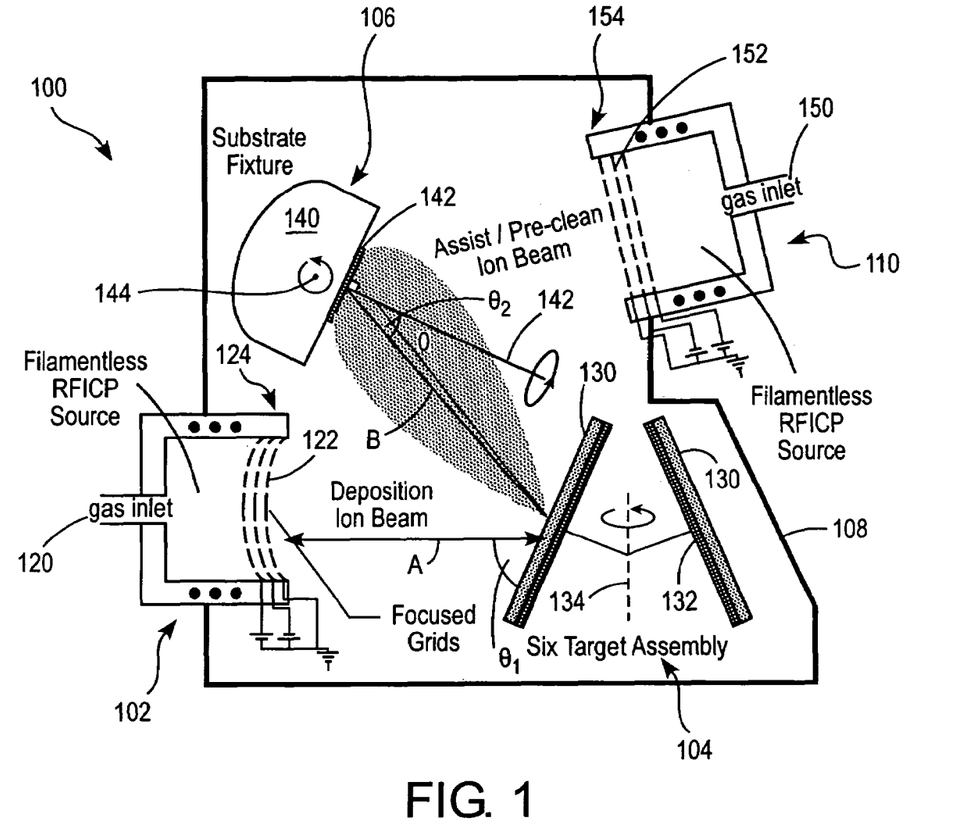
FIG. 1 shows an exemplary ion beam deposition (IBD) apparatus.

An exemplary ion beam deposition (IBD) apparatus is shown in FIG. 1. The FIG. 1 exemplary IBD apparatus 100 includes an ion beam source 102, a target assembly 104 and a substrate assembly 106 housed within a chamber 108. An optional source 110 for assisting the deposition and/or pre-clean of substrates can also optionally be included.

The ion beam source can be any suitable source. In the FIG. 1 embodiment, ion beam source 102 is a filamentless RF inductively coupled plasma (RFCIP) source. The source 102 includes a gas inlet 120 and a series of focusing grids 122, such as three focusing grids, across an opening at a projecting end 124. The source 102 has a diameter of about 20 cm with good beam collimation.

The target assembly can be any suitable target. In the FIG. 1 embodiment, the target assembly 104, located at a distance A from the source 102, includes a plurality of targets 130 mounted circumferentially on a rotating mounting device 132. The targets 130 rotate around axis 134. The targets 130 are mounted at an angle $2_1$ to the source 102 such that material ablated from the targets 130 are directed toward the substrate assembly 106. An exemplary distance A is about 80 cm. An example of a material for the target 130 is a 99.999% pure polycrystalline semiconductor, such as polycrystalline silicon. Adjusting the angle $2_1$ influences the density of the deposited film on the substrate and the purity of the deposited film, e.g., the Ar content. For example, if the angle $2_1$ increases from 45 degrees to 90 degrees, the concentration of Ar increases from 0.2 to 0.8%, and the concentration of hydrogen increases from 0.08 to 0.11%.

The substrate assembly can be any suitable source. In the FIG. 1 embodiment, the substrate assembly 106, located at a distance B from the source target assembly 104, includes a substrate fixture 140 with a mounting location for a substrate 142. The substrate fixture 140 both pivots on axis 144 to provide an angle of incidence $\theta_2$ of the material ablated from the targets 130 with respect the normal of the substrate 142 and rotates around axis 146. An exemplary distance B is about 80 cm. Adjusting the angle $\theta_2$ influences the density of the deposited film on the substrate and the internal stress of the deposited film. It has been observed that the stress level decreases as the angle $\theta_2$ from normal.

The optional source 110 for assisting the deposition and/or pre-clean of substrates can be any suitable source. In the FIG. 1 embodiment, the optional source 110 is a filamentless RF inductively coupled plasma (RFCIP) source and includes a gas inlet 150 and a series of focusing grids 152, such as three focusing grids, across an opening at a projecting end 154.

A base pressure in the ion beam deposition (IBD) apparatus is about $10^{-8}$ torr. During deposition using the ion beam deposition (IBD) apparatus of FIG. 1, a process pressure is about 0.1 mtorr.

Figure 2:
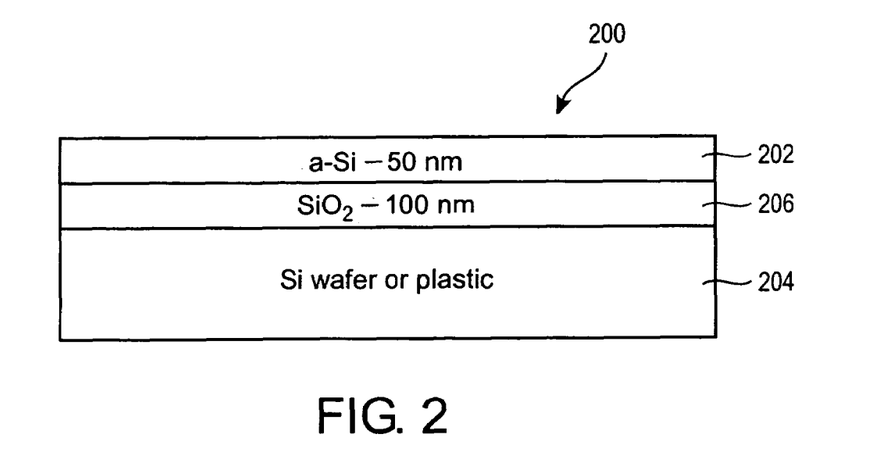
FIG. 2 shows, in schematic cross-section, a semiconductor structure including an $\alpha$-Si film deposited on a substrate.

FIG. 2 shows, in schematic cross-section, a semiconductor structure 200 including an α-Si film 202 deposited on a substrate 204, such as a silicon wafer or a plastic substrate. An intervening SiO$_2$ barrier layer 206 is also shown. After deposition, the α-Si film 202 can be crystallized into polycrystalline silicon by any suitable method, such as by laser annealing.

Films of deposited α-Si were investigated for morphology, density and composition, including impurity levels. The results are summarized below.

Figure 3A:
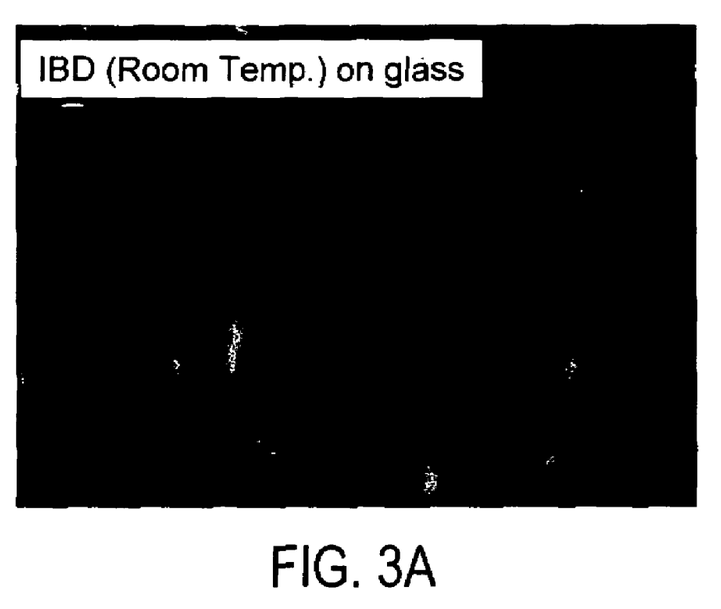
FIGS. 3A and 3B are scanning electron microscope images showing an amorphous silicon film on glass.
Figure 3B:
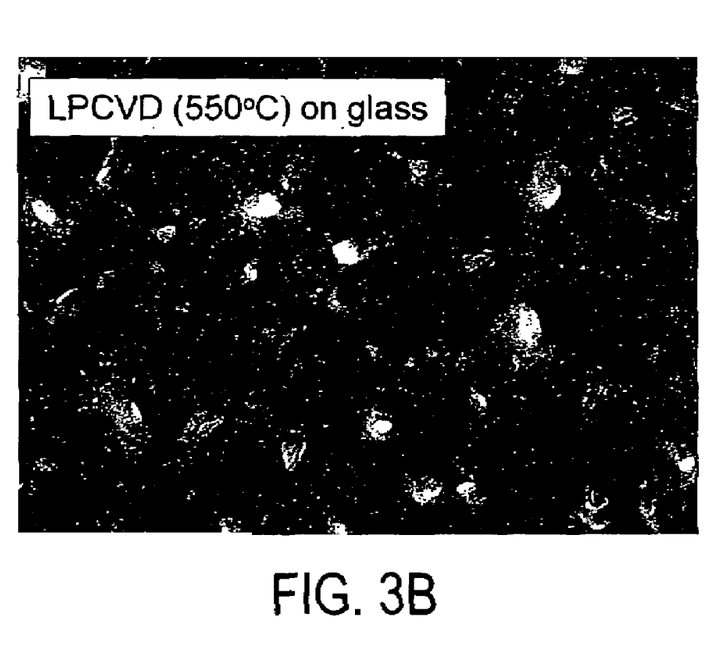

FIGS. 3A and 3B are scanning electron microscope images showing an amorphous silicon film. In FIG. 3A, the amorphous silicon film has been deposited at room temperature by IBD. In FIG. 3B, the amorphous silicon film has been deposited at 550° C. by LPCVD. Note that the grain size of silicon is nearly the same under both deposition methods. The observed grain size was up to about 500 nm (±10%), and averaged about 350 nm (±10%).

Figure 4A:
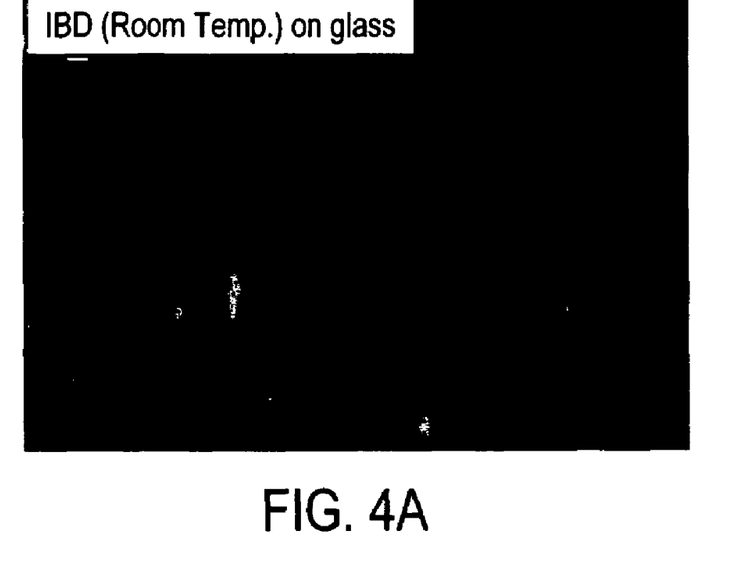
FIGS. 4A and 4B are scanning electron microscope images showing an amorphous silicon film on glass.
Figure 4B:
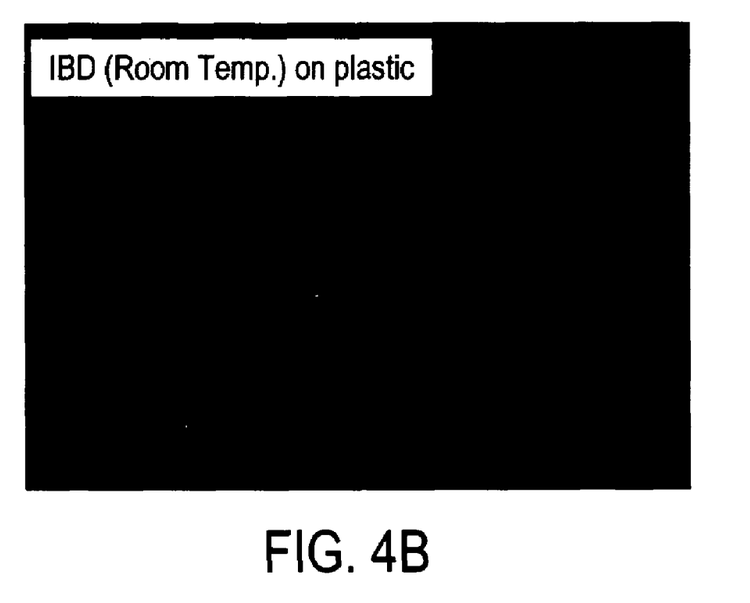

FIGS. 4A and 4B are scanning electron microscope images showing an amorphous silicon film deposited by IBD on glass (FIG. 4A) and deposited by IBD on plastic (FIG. 4B). In FIGS. 4A and 4B, the glass is Corning 1730 and the plastic is polyether sulfer (PES). In both FIG. 4A and FIG. 4B, the amorphous silicon film has been deposited at room temperature by IBD. Note that the grain size of silicon is nearly the same for both substrates and is nearly the same for both deposition by IBD and deposition by LPCVD (FIG. 3B). The observed grain size was up to about 500 nm (±10%), and averaged about 350 nm (±10%).

Figure 5:
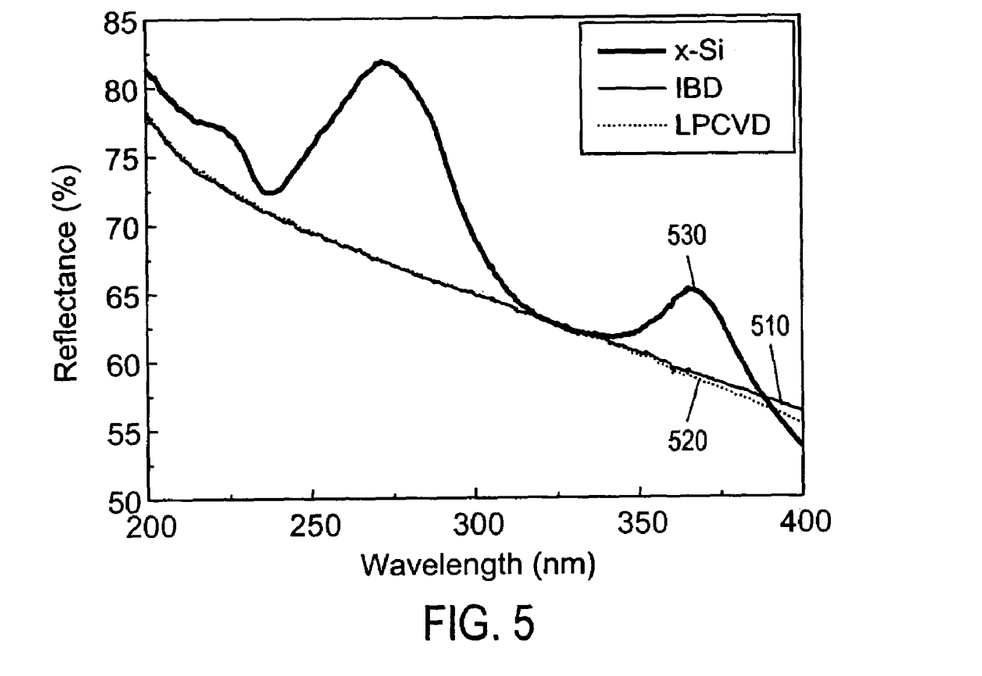
FIG. 5 is a graph of reflectance as a function of wavelength show UV-Reflectance results for an as-deposited $\alpha$-Si film.

FIG. 5 is a graph of reflectance as a function of wavelength show UV-Reflectance results for an as-deposited α-Si film. In this example, the substrate was quartz with the various α-Si/quartz structures formed with an approximate 50 nm thick Si film. In the FIG. 5 graph, the UV-Reflectance results for a α-Si film deposited by IBD 510, a α-Si film deposited at 550° C. by LPCVD 520 and a control sample of polycrystalline silicon 530 (for comparison) are shown. The results for the α-Si film deposited by IBD 510 and the α-Si film deposited by LPCVD 520 are virtually indistinguishable across the wavelengths shown, with no crystalline peak observed. In comparison, the results for polycrystalline silicon 530 include two major peaks indicating the polycrystalline structure of that sample. These peaks are related to the band gap for the polycrystalline silicon. In addition, the surface of the α-Si film was very smooth, as indicated by UV reflectance correlated to other samples with known RMS roughness.

Figure 6:
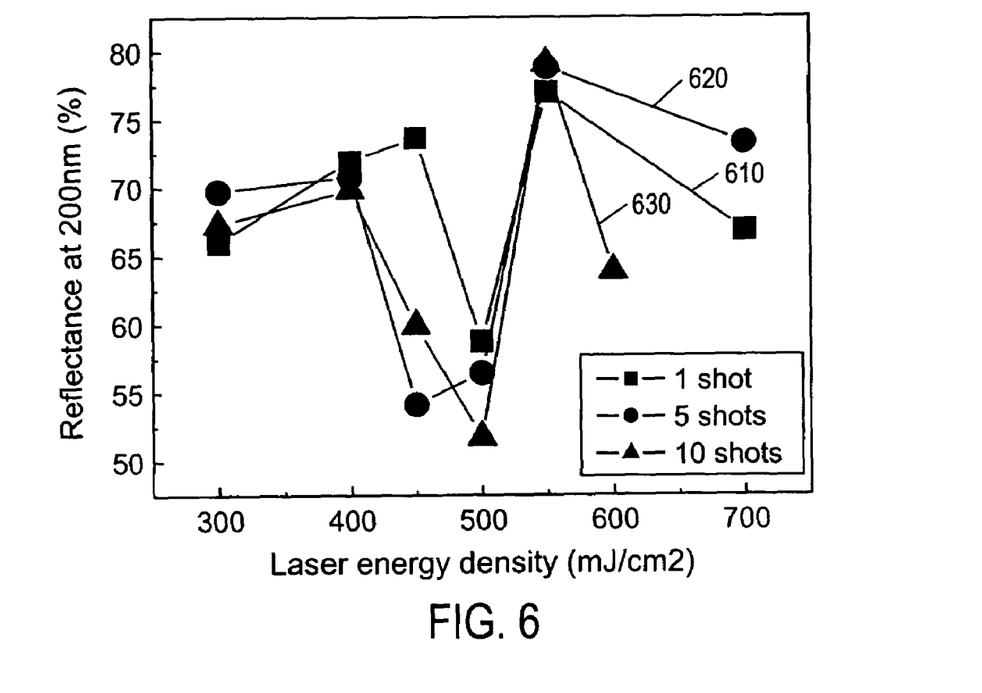
FIG. 6 is a graph of reflectance at 200 nm as a function of laser energy density results for a crystalline silicon film.

FIG. 6 is a graph of reflectance at 200 nm as a function of laser energy density results for a crystalline silicon film. To form the sample, as-deposited α-Si film was exposed to from 1 to 100 shots of an excimer laser with energy density varied from 250 to 750 mJ cm$^{-2}$ to crystallize grains of silicon. In the FIG. 6 graph, the UV-Reflectance results for a polycrystalline silicon film deposited by IBD and laser annealed with different total annealing energy is shown. The FIG. 6 traces correspond to 1 shot (610), 5 shots (620) and 10 shots (630). The results indicate that a laser energy density of about 450 to 500 mJ cm$^{-2}$ produced the largest observed grains and the highest surface roughness while a laser energy density of about 525 to 575 mJ cm$^{-2}$ produced the smallest observed grains and the lowest surface roughness. Both of these measurements were empirically derived from observations across a laser energy density of 250 to 750 mJ cm$^{-2}$, and additional local minima and maxima may be observed across different ranges of laser energy densities.

The density of the films were investigated by Rutherford Backscattering (RBS). Table 1 summarizes the results of these measurements on films prepared by the disclosed IBD method and films prepared by conventional sputtering. The results indicate that the IBD prepared films have about a 10% increased density compared to the sputter deposited films.

TABLE 1

| | Density |
|---|---|
| | Rutherford Back Scattering (cm$^{-2}$) |
| Sputter | 1030E15 |
| IBD | 1150E15 |

Figure 7A:
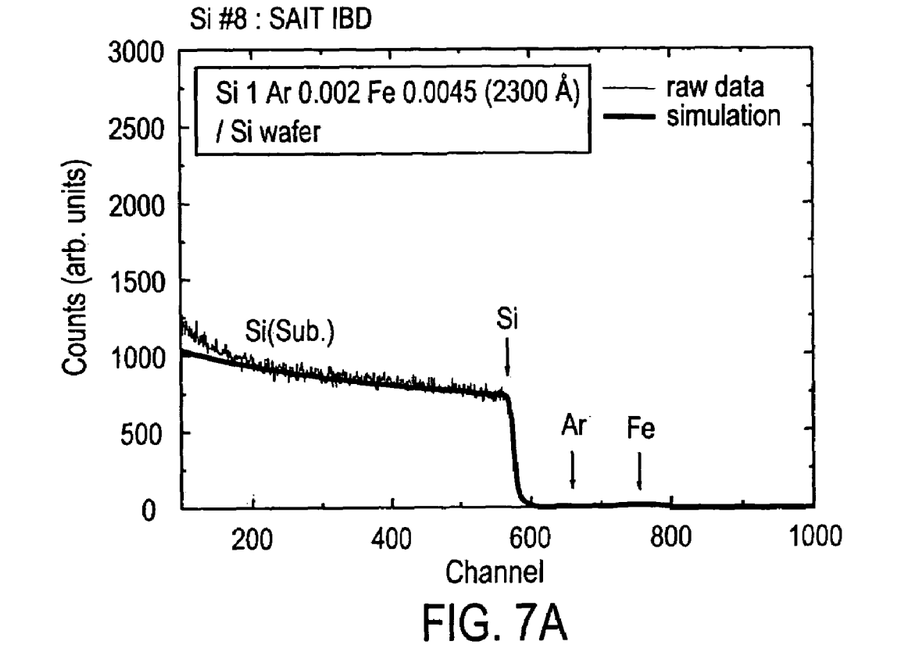
FIGS. 7A and 7B show graphs of elemental composition determined by RBS for as-deposited $\alpha$-Si films deposited by IBD (FIG. 7A) and by conventional sputtering techniques (FIG. 7B).
Figure 7B:
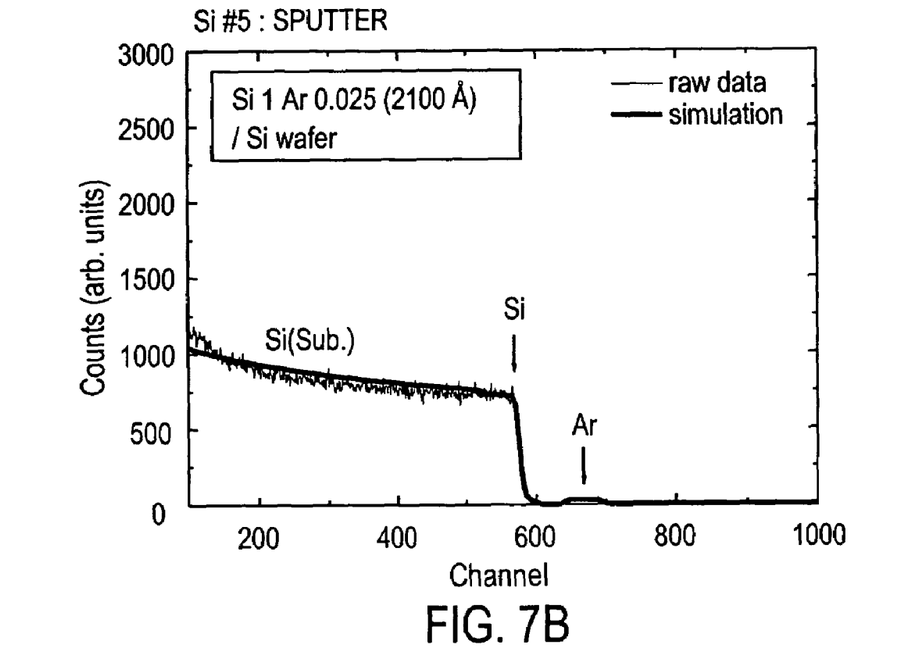

To investigate the impurity content of films formed by IBD, RBS was used to determine the composition of as-deposited films. FIGS. 7A and 7B show graphs of elemental composition determined by RBS for as-deposited α-Si films deposited by IBD (FIG. 7A) and by conventional sputtering techniques (FIG. 7B). FIG. 7A indicates the presence of iron in the film. Iron or another metal associated with the material of components in the IBD apparatus, such as the grid over the source, can be present in the as-deposited α-Si films in amounts greater than 0.005 at. %. Other metals that may be present can include copper or other soft metals. As a comparison, note the absence of such elemental peak in the FIG. 7B graph. FIG. 7A also indicates a very low presence or an absence of a peak associated with the carrier gas from the deposition process, for example an inert gas such as argon. Test results indicate Ar in an amount of less than 0.2 at. % is present in the IBD as-deposited α-Si films. As a comparison, note the presence of such elemental peak in the FIG. 7B graph for sputter deposition, where Ar is present at greater than about 2.4 at. %.

Figure 8A:
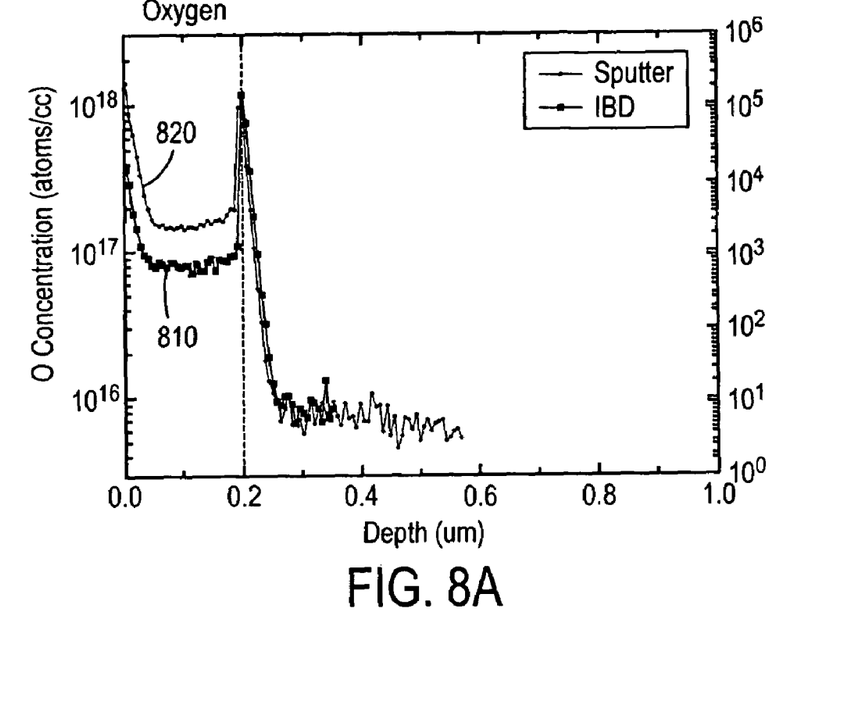
FIGS. 8A and 8B show results using secondary ion mass spectrometry (SIMS) on as-deposited $\alpha$-Si films deposited by IBD and, for comparison, deposited by sputtering.
Figure 8B:
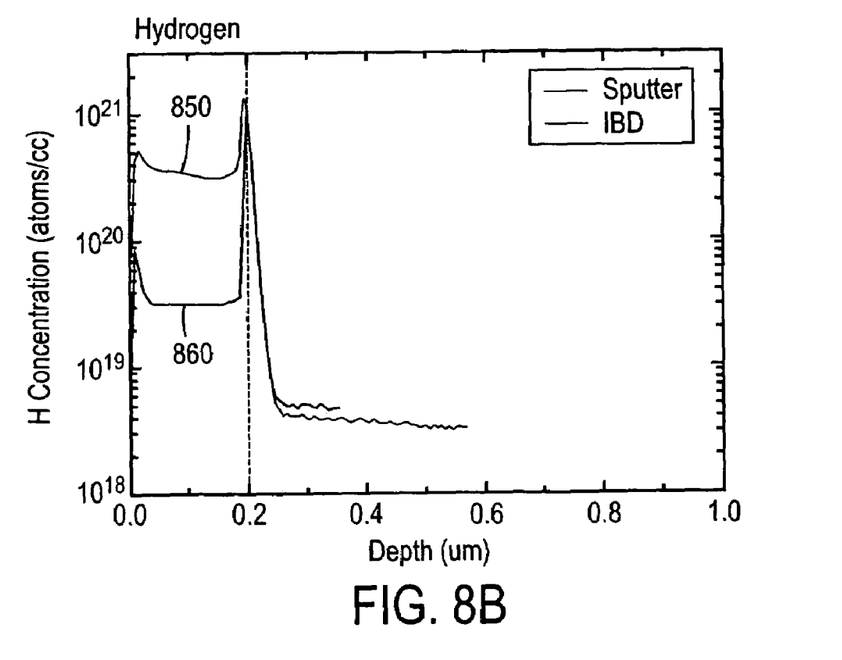

FIGS. 8A and 8B show results using secondary ion mass spectrometry (SIMS) on as-deposited α-Si films deposited by IBD and, for comparison, deposited by sputtering. In FIG. 8A, the oxygen concentration is show for as-deposited α-Si films deposited by IBD 810 and, for comparison, deposited by sputtering 820. In FIG. 8B, the hydrogen concentration is show for as-deposited α-Si films deposited by IBD 850 and, for comparison, deposited by sputtering 860. The lower oxygen and hydrogen content in the IBD deposited films in comparison to sputter deposited films indicates a higher quality film occurs from the IBD deposition method.

Table 2 summarizes results for different impurities in as-deposited α-Si films deposited by IBD and, for comparison, by sputtering. In most cases, at least an order of magnitude improvement is observed for the IBD deposition method as compared to the sputtering method.

TABLE 2

Summary of Impurity Content

| Element | Sputter Method (at. %) | IBD Method (at. %) |
|---|---|---|
| Ar | 2.4 | 0.2 |
| O | 0.002 | 0.0002 |
| H | 0.8 | 0.08 |
| Fe | 0 | 0.05 |

Process parameter for the two deposition methods are shown in Table 3.

TABLE 3

Process Parameters

| | Process Parameter | |
|---|---|---|
| | IBD | Sputter |
| Base Pressure (torr) | $1 \times 10^{-8}$ | $1 \times 10^{-6}$ |
| Process Pressure (mtorr) | 0.1 | 5 |
| Deposition Rate (Å/sec) | 0.7 | 0.5 |
| Temperature | Room temperature (self heating) | Room temperature |
| Energy Source | AR beam (RF-type 600 V, 300 mA, tilting angle = 45°) | RF power (200 W) |

The disclosed methods can be used to produce a thin film transistor. For example, a semiconductor film is prepared on an insulating substrate arranged in a deposition chamber by depositing a semiconductor film onto the insulating substrate using ion beam deposition. A temperature of the insulating substrate during the depositing does not generally exceed 250° C. A source region, a drain region, and a channel region between the source region and the drain region are then formed in the semiconductor film. A gate electrode is also formed adjacent to the channel region.

Figure 9:
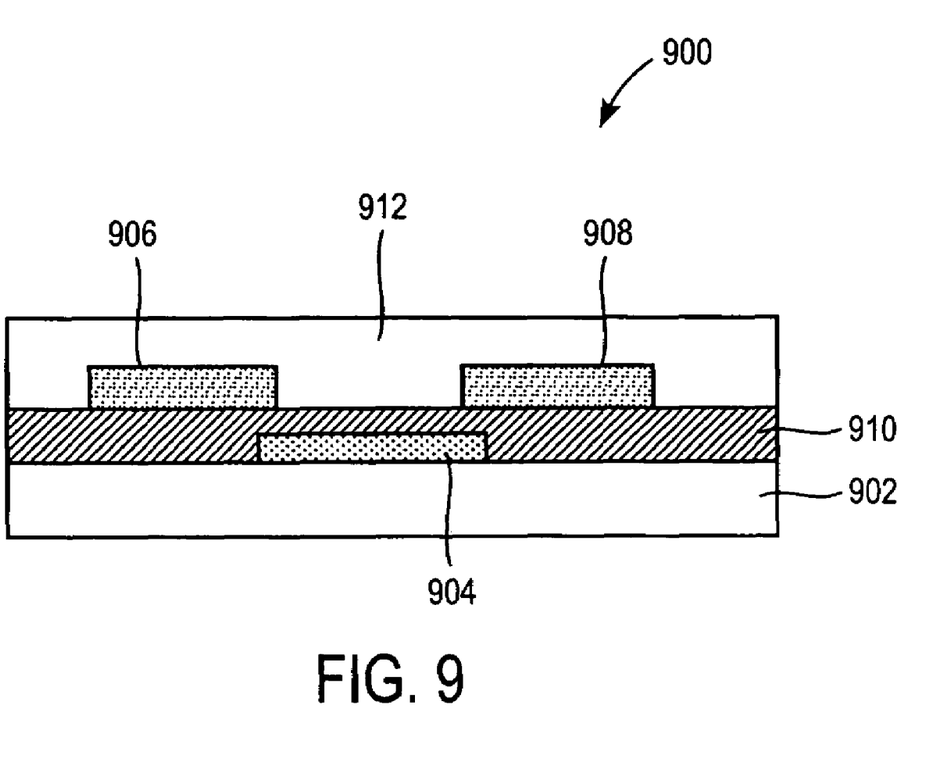
FIG. 9 shows an exemplary semiconductor structure.

An exemplary embodiment of a semiconductor structure is presented in FIG. 9. Exemplary embodiments of a semiconductor structure 900 comprise a substrate 902, a gate 904, a source 906 and a drain 908. The source 906 and the drain 908 are separated from the gate 904 by an insulator 910. A channel layer 912 is formed in the device.

In exemplary embodiments, the semiconductor film contains less than 0.001% oxygen, less than 1.0% argon, and less than 0.5% hydrogen, in atomic percent. Further, the substrate includes an insulating material, which may be rigid or flexible. A preferred insulating material comprises a plastic material.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A method of preparing a semiconductor film on a substrate, comprising:
   arranging an insulating substrate in a deposition chamber; and
   depositing a semiconductor film onto the insulating substrate using ion beam deposition (IBD),
   wherein a temperature of the insulating substrate during the depositing does not exceed 250° C., and wherein the semiconductor film comprises up to about 0.5 at.% of an inert gas.

2. The method of claim 1, comprising adjusting an angle of incidence of at least one of an ion beam incident on a target and a material beam incident on a substrate, wherein the angle changes a quality parameter of the semiconductor film.

3. The method of claim 1, wherein the semiconductor film comprises Si.

4. The method of claim 1, wherein the inert gas is argon.

5. The method of claim 1, wherein the semiconductor film is a silicon film with substantially an amorphous structure.

6. The method of claim 1, wherein the insulating substrate is rigid.

7. The method of claim 1, wherein the insulating substrate is flexible.

8. The method of claim 1, wherein the insulating substrate comprises a plastic material.

9. The method of claim 1, further comprising crystallizing the semiconductor film to thereby form a polycrystalline semiconductor film.

10. The method of claim 1, further comprising evacuating the deposition chamber to a base pressure of less than or equal to $10^{-7}$ Torr prior to depositing the semiconductor film.

11. A method to produce a thin film transistor, the method comprising:
    preparing a semiconductor film on an insulating substrate according to the method of claim 1;
    forming, in the semiconductor film, a source region, a drain region, and a channel region between the source region and the drain region; and
    forming a gate electrode adjacent to the channel region.

12. The method of claim 2, wherein the quality parameter of the semiconductor film is one or more of density, argon content and internal stress.

13. A method of preparing a semiconductor film on a substrate, comprising:

arranging an insulating substrate in a deposition chamber; and depositing a semiconductor film onto the insulating substrate using ion beam deposition (IBD), wherein a temperature of the insulating substrate during the depositing does not exceed 250° C., wherein the semiconductor film contains less than 0.001% oxygen, less than 1.0% argon, and less than 0.5% hydrogen, in atomic percent.

* * * * *